United States Patent [19]
Myer

[11] Patent Number: 6,069,531
[45] Date of Patent: May 30, 2000

[54] FEED FORWARD AMPLIFIER IMPROVEMENT INCORPORATING AN AUTOMATIC GAIN AND PHASE CONTROLLER

[75] Inventor: Robert Evan Myer, Denville, N.J.

[73] Assignee: Lucent Technologies Inc., Murray Hill, N.J.

[21] Appl. No.: 09/144,245

[22] Filed: Aug. 31, 1998

[51] Int. Cl.[7] ............................................. H03F 1/32
[52] U.S. Cl. ............................................. 330/151; 330/149
[58] Field of Search ............................... 330/151, 149, 330/129

[56] References Cited

U.S. PATENT DOCUMENTS

| | | | |
|---|---|---|---|
| 4,580,105 | 4/1986 | Myer | 330/149 |
| 4,885,551 | 12/1989 | Myer | 330/151 |
| 5,789,976 | 8/1998 | Ghannouchi et al. | 330/149 |
| 5,847,603 | 12/1998 | Myer | 330/151 |
| 5,874,856 | 2/1999 | Van Horn | 330/149 |
| 5,877,653 | 3/1999 | Kim et al. | 330/149 |

*Primary Examiner*—Robert Pascal
*Assistant Examiner*—Khanh Van Nguyen

[57] ABSTRACT

The present invention is a method and a feed forward circuit incorporating an automatic gain and phase controller for controlling amplitude gain and phase shift being applied to an input signal of an amplifier undergoing changing conditions. The automatic gain and phase controller is configured to monitor the amplifier output signals and manipulate the amplitude and phase of the amplifier input signal (via a gain and phase adjuster) such that the amplitude and phase of the amplifier output signals are substantially identical to those of previous amplifier output signals.

14 Claims, 3 Drawing Sheets

FEED FORWARD AMPLIFIER IMPROVEMENT INCORPORATING AN AUTOMATIC GAIN AND PHASE CONTROLLER

FIELD OF THE INVENTION

This invention relates to high power linear amplifiers and more particularly to control systems employing feed forward to reduce distortion of high power linear amplifiers.

BACKGROUND OF THE INVENTION

RF linear amplifiers utilize devices that exhibit non-linear characteristics at higher power levels whereby signal distortion is introduced. For example, if more than one carrier signal is applied to a linear amplifier, its non-linear characteristics cause an unwanted multiplicative interaction of the carrier signals being amplified and the amplifier output contains intermodulation products or distortion. These intermodulation products cause interference which may exceed established transmission standards.

As is well known, intermodulation distortion can be reduced by separating the distortion component of the amplifier output and feeding forward the distortion component to cancel the distortion in the amplifier output signal. FIG. 1 is a simplified block diagram of a feed forward circuit 10 disclosed in U.S. Pat. No. 4,885,551. Feed forward circuit 10 receives input signal S having at least one carrier in a prescribed frequency range. Input signal S is split into signals S(12a) and S(12b), wherein signals S(12a) and S(12b) are signals representative of the input signal S. For ease of discussion, numeric references in parenthesis are used herein to indicate from which component(s) a signal was output, and alphanumeric references in parenthesis are used herein to indicate that the component(s) from which the signal was output has more than one output. For example, signal S(12a) would indicate that it was an output signal of splitter 12 and that it was one of a multitude of output signals from splitter 12. If a signal has more than one reference, the order of the references would indicate the path of the signal. For example, signal S(12a,14) would indicate that it was first an output signal of the splitter 12 and then an output signal of an amplifier 14. The output signal of the latter referenced component would be a signal representative of the preceding referenced component, e.g., signal S(12a,14) is a signal representative of the signal S(12a).

Signal S(12a) is applied to a first or main circuit path having main amplifier 14 which amplifies signal S(12a) and introduces distortion signal D(14). Thus, main amplifier 14 produces output signal S(14) comprising signals S(12a,14) and D(14). Signal S(14) is applied to directional coupler 18 which directs signals S(18a) and S(18b) to delay 22 and cancellation circuit 20, respectively, wherein signal S(18a) comprises signals S(12a,14,18a) and D(14,18a) and signal S(18b) comprises signals S(12a,14,18b) and D(14,18b). Signal S18(a) is delayed by delay 22 to produce output signal S(22) comprising S(12a,14,18a,22) and D(14,18a, 22).

Signal S(12b) is applied to a second circuit path where it is delayed by delay 16 to produce output signal S(16) comprising signal S(12b,16). Signal S(12b,16) is combined with signal S(18b) in cancellation circuit 20 to form output signal S(20). In cancellation circuit 20, signal S(12a,14,18b) (via signal S(18b)) is canceled by signal S(12b,16). Thus, signal S(20) comprises distortion signal D(14,18b,20). The signal S(20) is applied to correction amplifier 24 which amplifies signal S(20) and introduces distortion signal D(24). Note that distortion signal D(24) is approximately 10,000 times smaller in amplitude than distortion signal D(14). Thus, correction amplifier 24 produces output signal S(24) comprising distortion signals D(14,18b,20,24) and D(24). Signal S(24) is combined with signal S(22) in cancellation circuit 26 to produce output signal S(26). The amplitude and phase of distortion signal D(14,18b,20,24) (via signal S(24)) should be approximately equal to the amplitude and phase of distortion signal D(14,18a,22) (via signal S(22)) such that distortion signals D(14,18b,20,24) and D(14,18a,22) cancel each other in cancellation circuit 26. Thus, signal S(26) comprises S(12a, 14,18a,22,26) and D(24,26). In effect, the amplitude of the distortion signal in output signal S(26) is being reduced by substituting a signal representative of distortion signal D(14) (i.e., D(14,18a,22)) with distortion signal D(24), which has a smaller amplitude.

Ideally, correction amplifier 24 should apply a constant amplitude gain and/or phase shift to signal S(20) such that the amplitude and phase of distortion signal D(14,18b,20, 24) (via signal S(24)) should always be approximately equal to the amplitude and phase of distortion signal D(14,18a,22) for purposes of achieving good cancellation. However, as conditions change over time, such as temperature, the amplitude gain and/or phase shift applied to signal S(20) by correction amplifier 24 may vary. Such variation may adversely affect the amount distortion signal D(14,18b,20, 24) cancels distortion signal D(14,18a,22). Therefore, there exists a need to compensate for changes in conditions to the correction amplifier such that good cancellation of distortion signals is maintained.

SUMMARY OF THE INVENTION

The present invention is a method and a feed forward circuit incorporating an automatic gain and phase controller for controlling amplitude gain and phase shift being applied to an input signal of an amplifier undergoing changing conditions. The automatic gain and phase controller is configured to monitor the amplifier output signals and manipulate the amplitude and phase of the amplifier input signal (via a gain and phase adjuster) such that the amplitude and phase of the amplifier output signals are substantially identical to those of previous amplifier output signals.

In one embodiment, the automatic gain and phase controller controls the amplitude and phase of the amplifier output signal by: splitting the amplifier output signal into output signals S(a) and S(b); saturating the output signal S(a) to produce a saturated output signal S(a); adjusting the amplitude and phase of the output signal S(b) to produce an adjusted output signal S(b), wherein the amplitude and phase of the output signal are initially adjusted to substantially match the amplitude and phase of an input signal; inputting the adjusted output signal S(b) to a log detector to produce a saturated adjusted output signal S(b) and a first signal S(log) indicating the amplitude of the adjusted output signal S(b); mixing the saturated adjusted output signal S(b) with the saturated output signal S(a) to produce a first mixed signal; inputting the input signal to the log detector to produce a saturated input signal and a second signal S(log) indicating the amplitude of the input signal; mixing the saturated input signal with the saturated output signal S(a) to produce a second mixed signal; determining a phase difference between the adjusted output signal S(b) and the input signal using the first and second mixed signals; and determining an amplitude difference between the adjusted output signal S(b) and the input signal using the first and second signals S(log).

Advantageously, the automatic gain and phase controller uses a common log detector to measure and saturate the amplitudes of amplifier output and input signals in order to eliminate variations in amplitude measurement and saturation that might be present due to the use of multiple log detectors.

BRIEF DESCRIPTION OF THE DRAWINGS

The features, aspects, and advantages of the present invention will become better understood with regard to the following description, appended claims, and accompanying drawings where:

DETAILED DESCRIPTION

Figure 1:
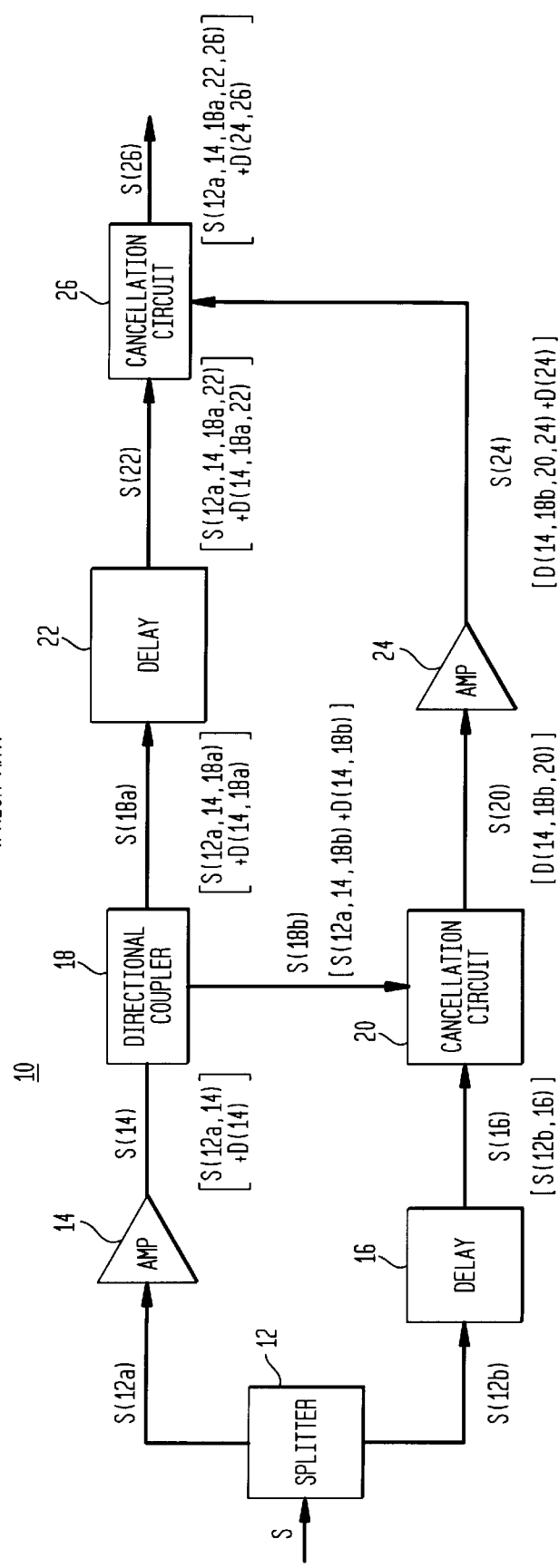
FIG. 1 depicts a block diagram of a feed forward circuit.
Figure 2:
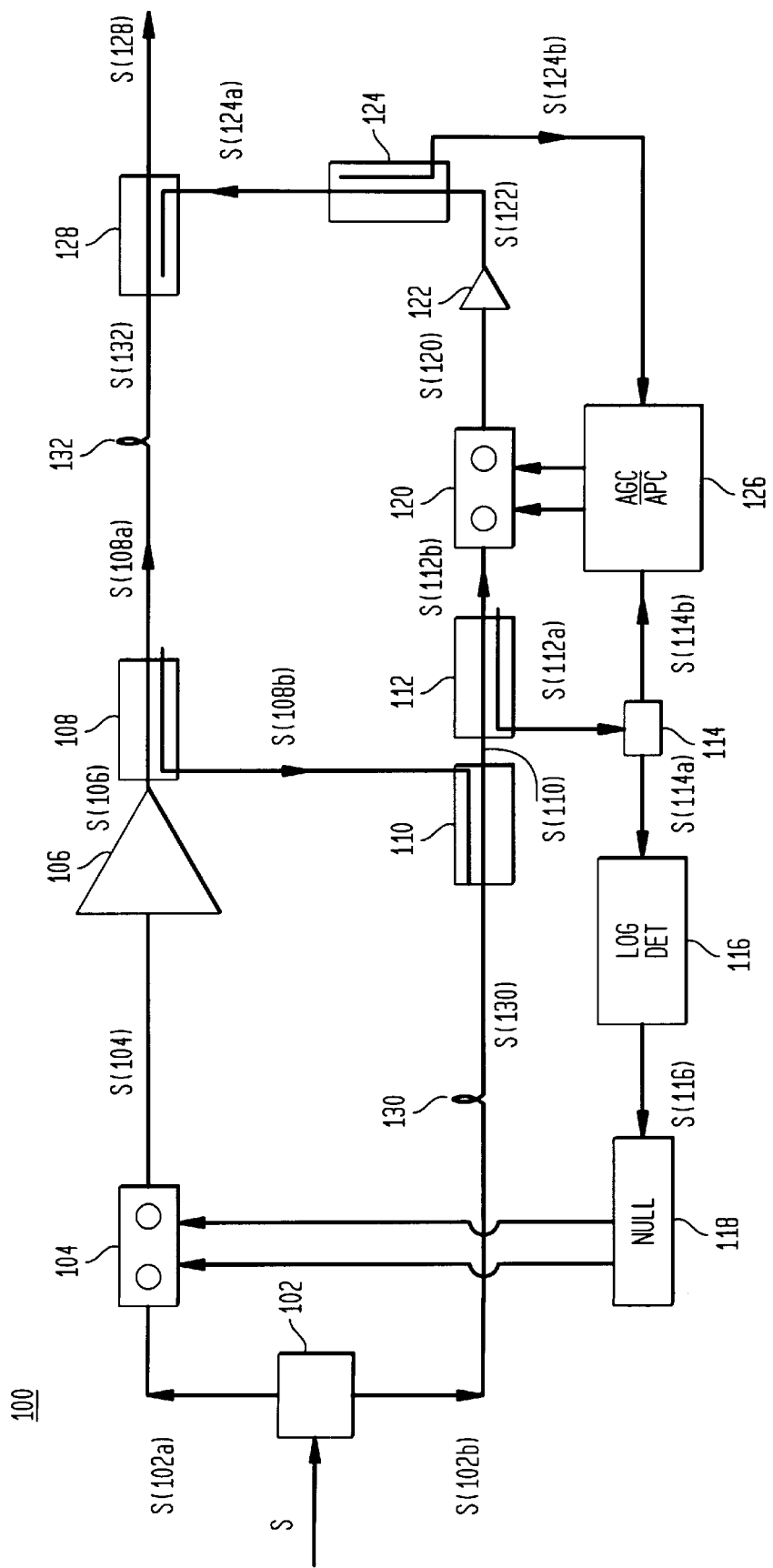
FIG. 2 depicts a block diagram of a feed forward circuit in accordance with the present invention.

FIG. 2 depicts a block diagram of a feed-forward circuit 100 operative to amplify signals across a prescribed frequency range in accordance with the present invention. Feed forward circuit 100 includes a splitter 102 for applying composite input signal S to a first circuit path and a second circuit path, wherein input signal S comprises one or more carrier signals $S_C$ across a prescribed band. Splitter 102 receives input signal S and applies signals S(102a) and S(102b), which are both signals representative of the input signal S to the first circuit path and the second circuit path, respectively. For purposes of this application, the term "splitter" and "directional coupler" are used interchangeably and shall be construed to define the same component.

The first circuit path includes gain and phase adjuster 104, main amplifier 106, directional coupler 108, delay 132, and cancellation circuit 128. The second circuit path includes delay 130, cancellation circuit 110, directional coupler 112, gain and phase adjuster 120, correction amplifier 122, directional coupler 124, null circuit 118, log detector 116, splitter 114 and automatic gain and phase controller 126.

In the first circuit path, the amplitude and/or phase of signal S(102a) are adjusted by gain and phase adjuster 104 (under the control of null circuit 118) to produce output signal S(104) comprising signal S(102a,104). Specifically, the gain and/or phase of signal S(102a) are adjusted such that a signal representative of it may be subsequently used to cancel a signal representative of signal S(102b), as will be described herein. Main amplifier 106 amplifies signal S(104) and introduces distortion signal D(106), thus producing output signal S(106) comprising signal S(102a,104,106) and distortion signal D(106).

Directional coupler 108 receives signal S(106) and applies signal S(108a) and S(108b) to delay 132 and cancellation circuit 110, respectively, wherein signal S(108a) comprises signal S(102a,104,106,108a) and distortion signal D(106,108a), and signal S(108b) comprises signal S(102a,104,106,108b) and distortion signal D(106,108b). Delay 132 delays signal S(108a) without distortion for a time delay $T_{132}$ that is set to compensate for the delay of a signal traveling through cancellation circuit 110, directional coupler 112, gain and phase adjuster 120, correction amp 122, and directional coupler 124. Delay 132 produces output signal S(132) comprising signal S(102a, 104,106,108a, 132) and distortion signal D(106,108a, 132). Cancellation circuit 128 combines signal S(132) with signal S(124a) from directional coupler 124 to produce output signal S(128), as will be described herein.

In the second circuit path, delay 130 delays signal S(102b) without distortion for a time delay $T_{130}$, wherein the time delay $T_{130}$ is set to compensate for the delay of a signal traveling through gain and phase adjuster 104, main amplifier 106, and directional coupler 108. Delay 130 produces output signal S(130) comprising signal S(102b,130). Signal S(130) is combined in cancellation circuit 110 with signal S(108b) to produce output signal S(110). If the amplitude and/or phase of signal S(102a) is properly adjusted by gain and phase adjuster 104, signal S(102a,104,106,108b) (via signal S(108b)) should be canceled or substantially canceled by signal S(102b,130) (via signal S(130)). Thus, signal S(110) comprises distortion signal D(106,108b, 110) and difference signal ΔS( 110), which is the difference between signals S(102b,130) and S(102a,104,106,108b). For ease of discussion, it will be assumed that signal S(102a,104,106, 108b) is canceled or substantially canceled by signal S(102b,130). Therefore, difference signal ΔS(110) is deemed a negligible component of signal S(110)—that is, signal S(110) is viewed hereinafter as comprising only distortion signal D(106,108b,110) unless otherwise specified herein.

Signal S(110) is applied to directional coupler 112, which directs output signals S(112a) and S(112b) to splitter 114 and gain and phase adjuster 120, respectively, wherein signal S(112a) comprises distortion signal D(106,108b,110, 112a), and signal S(112b) comprises distortion signal D(106,108b,110,112b). Splitter 114 splits signal S(112a) into signals S(114a) and S(114b), wherein signal S(114a) comprises distortion signal D(106,108b,110,112a,114a), and signal S(114b) comprises distortion signal D(106,108b,110, 112a,114b). Signals S(114a) and S(114b) are applied to log detector 116 and automatic gain and phase controller 126, respectively.

In log detector 116, the amplitude of signal S(114a) is measured to produce an output signal S(116) which indicates the amplitude of signal S(114a). If signal S(102a,104,106, 108b) was not canceled or substantially canceled by signal S(102b,130), signals S(114a) would also include difference signal ΔS(110,112a,114a) (i.e., representative signal of ΔS(110)), which typically has a larger amplitude than distortion signal D(106,108b,110,112a,114a). The presence of ΔS(110,112a,114a) in signal S(114a) will cause log detector 116 to output signal S(116) to indicate the amplitude of the larger amplitude signals that collectively comprises signal S(116)—that is, when difference signal ΔS(110,112a, 114a) is present, signal S(116) will typically indicate the amplitude of difference signal ΔS(110,112a,114a). Such indication of difference signal ΔS(110,112a,114a)'s amplitude is subsequently used to further minimize the presence of difference signal ΔS(110,112a, 114a).

Signal S(116) is received by null circuit 118, which uses signal S(116) to adjust gain and phase controller 104 such that the difference signal ΔS(110) is minimized in output signal S(110). The manner is which null circuit 118 uses signal S(116) to adjust gain and phase adjuster 104 is well known in the art.

From directional coupler 112, signal S(112b) is directed to gain and phase controller 120 where the amplitude and/or phase of signal S(112b) are adjusted under the control of automatic gain and phase controller 126. The amplitude and/or phase of signal S(112b) is adjusted such that a signal representative of it may be subsequently used to cancel distortion signal D(106,108a,132) (in signal S(132)), as will be described herein.

Gain and phase adjuster 120 outputs signal S(120) comprising distortion signal D(106,108b,110,112b,120). Correction amplifier 122 amplifies signal S(120) and introduces distortion signal D(122), thus producing output signal S(122) comprising distortion signal D(106,108*b*,110,112*b*, 120,122) and distortion signal D(122). Signal S(122) is applied to directional coupler 124 which directs signals S(124*a*) and S(124*b*) to cancellation circuit 128 and automatic gain and phase controller 126, respectively, wherein signal S(124*a*) comprises distortion signals D(106,108*b*, 110,112*b*,120,122,124*a*) and D(122,124*a*), and signal S(124*b*) comprises distortion signals D(106,108*b*,110,112*b*, 120,122,124*b*) and D(122,124*b*).

If the gain and phase of distortion signal D(106,108*b*,110, 112*b*) (in signal S(112*b*)) are properly adjusted by gain and phase controller 120, then distortion signal D(106,108*a*,132) (in signal S(132)) should be canceled or substantially canceled by distortion signal D(106,108*b*,110,112*b*,120,122, 124*a*) (in signal S(124*a*)). However, the amount of amplitude gain and/or phase shift applied to distortion signal D(106,108*b*,110,112*b*,120) by correction amplifier 122 will vary as conditions, such as temperature, change over time. This will affect the amount distortion signal D(106,108*a*, 132) is canceled by the distortion signal D(106,108*b*,110, 112*b*,120,122,124*a*).

The present invention utilizes an automatic gain and phase controller that compensates for variations in amplitude gain and/or phase shifts being applied to a signal by an amplifier under changing conditions. Automatic gain and phase controller 126 uses input signal S(112*b*) (of gain and phase adjuster 120) and output signal S(122) (of correction amplifier 122) to manipulate gain and phase adjuster 120 such that the output signal S(122) of correction amplifier 122 has little or no variations in amplitude and phase from previous output signals S(122) under changing conditions.

Figure 3:
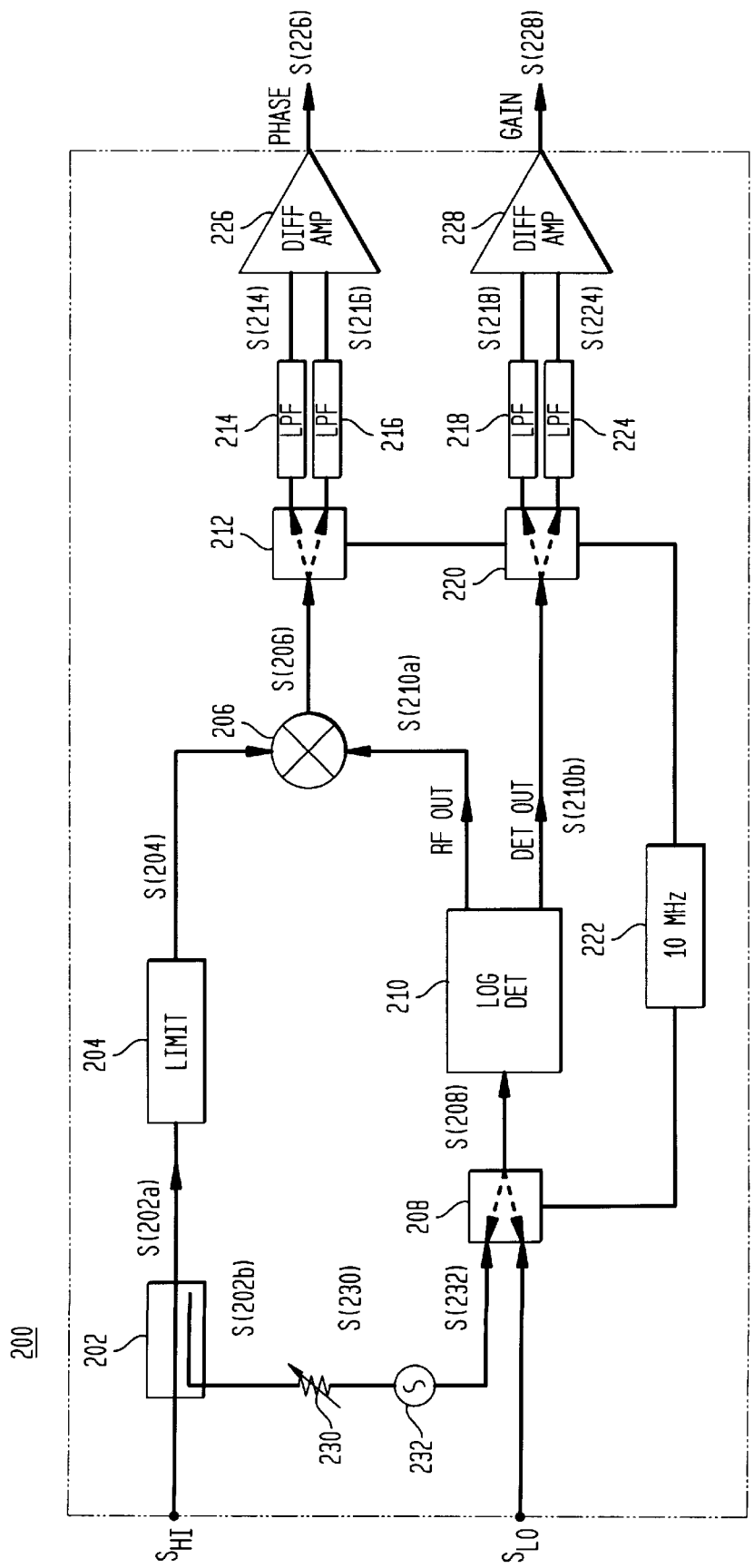
FIG. 3 depicts a block diagram of an automatic gain and phase controller in accordance with one embodiment of the present invention.

FIG. 3 depicts a automatic gain and phase controller 200 used in accordance with one embodiment of the present invention. Automatic gain and phase controller 200 receives signal S(124*b*) and S(114*b*), which are hereinafter respectively referred to as $S_{HI}$ and $S_{LO}$. Signal $S_{HI}$ is applied to directional coupler 202, which directs signals S(202*a*) and S(202*b*) to limiter 204 and attenuator 230, respectively. In limiter 204, the amplitude of signal S(202*a*) is saturated to produce a signal S(204), which is a signal representative of S(202*a*) having a saturated amplitude or constant peak output (or saturated signal S(202*a*)). Signal S(204) is subsequently directed to mixer 206 where signal S(204) is used as a reference signal for determining phase differences between signals S(232) and $S_{LO}$, as will be described herein.

The amplitude of signal S(202*b*) is adjusted by attenuator 230 to produce signal S(230) comprising signal S(202*b*, 230). Signal S(230) is directed to phase shifter 232, which adjusts the phase of signal S(230) to produce output signal S(232). In the initial configuration of feed forward circuit 100 and automatic gain and phase controller 200, attenuator 230 and phase shifter 232 are set to adjust the amplitude and phase of their respective input signals such that the amplitude and phase of signal S(232) are identical or substantially identical to the amplitude and phase of signal $S_{LO}$—that is, the amount of adjustment to amplitude and phase being applied to a signal by attenuator 230 and phase shifter 232 remains constant after initial configuration.

Signals S(232) and $S_{LO}$ are provided as inputs to switch 208. Switch 208 has a first and a second position. In the first position, switch 208 will direct signal S(232) to log detector 210. In the second position, switch 208 will direct signal $S_{LO}$ to log detector 210. Thus, switch 208 will produce an output signal S(208) comprising either signal S(232) or signal $S_{LO}$ depending on the position of switch 208.

Log detector 210 receives signal S(208) and outputs signals S(210*a*) and S(210*b*), wherein signals S(210*a*) is a signal representative of signal S(208) with a saturated amplitude (or saturated signal S(208)), and signal S(210*b*) is a signal indicating log of the amplitude of signal S(208). Signals S(210*a*) and S(210*b*) are directed, respectively, to mixer 206 and switch 220 having a first and a second position. Note that the term log detector, as used in this application, shall be construed to define a component operable to saturate the amplitude of a signal and measure the log of a signal's amplitude. Similarly, the term limiter shall be construed to define a component operable to saturate the amplitude of a signal.

At mixer 206, input signals S(204) and S(210*a*) are mixed to produce output signal S(206), which is used to determine the phase difference between signals S(232) and $S_{LO}$. Signal S(206) is subsequently provided to switch 212, which has a first and a second position. From switches 212 and 220, signals S(206) and S(210B) are provided as input signals to a plurality of low pass filters 214,216,218,224.

Switches 208, 212 and 220 are collectively controlled by oscillator 222 (e.g. 10 MHz oscillator), which causes switches 208, 212 and 220 to simultaneously switch between position 1 and position 2. When switch 208 is in position 1, switch 208 is directing signal S(232) to log detector 210. At the same time, switches 212 and 220 are also in position 1 and directing signals S(206) and S(210*b*) to low pass filters 214 and 218, respectively. By contrast, when switch 208 is in position 2, switch 208 is directing signal $S_{LO}$ to log detector 210. At the same time, switches 212 and 220 are also in position 2 and directing signals S(206) and S(210*b*) to low pass filters 216 and 224, respectively.

Specifically, when switch 208 is in position 1, mixer 206 is outputting a signal S(206) comprising a mixture of reference signal S(204) (which, as mentioned earlier, is a signal representative of $S_{HI}$ with a saturated amplitude) and signal S(210*a*) that is representative of $S_{HI}$ with a saturated amplitude and adjusted amplitude and phase. Such signals S(210*a*) and S(206) are also referred to herein as first signal S(210*a*) and first signal S(206). By contrast, when switch 208 is in position 2, mixer 206 is outputting a signal S(206) comprising a mixture of reference signal S(204) and signal S(210*a*) that is representative of signal $S_{LO}$ with a saturated amplitude. Such signals S(210*a*) and S(206) are also referred to herein as second signal S(210*a*) and second signal S(206). Note that first and second signals S(210*a*) are mixed with the same reference signal S(204) allowing for an accurate measurement of phase difference between signals S(232) and $S_{LO}$, as will be described herein.

First signal S(206) and second signal S(206) are directed by switch 212 to low pass filters 214 and 216, respectively. Low pass filters 214 and 216 produce output signals S(214) and S(216), respectively, which are directed to differential amplifier 226. Differential amplifier 226 produces an output signal S(226) which indicates the phase difference between signals S(232) and $S_{LO}$. Such signal S(226) is subsequently used to adaptively control gain and phase adjuster 120 such that the phase of output signal S(122) matches or substantially matches the phase of the previous output signals S(122).

When switch 208 is in position 1, log detector 210 is outputting a signal S(210*b*) indicating the amplitude of signal S(232). Such signal S(210*b*) is also referred to herein as first signal S(210*b*). By contrast, when switch 208 is in position 2, log detector 210 is outputting a signal S(210*b*)

indicating the amplitude of signal $S_{LO}$. Such signal S(210b) is also referred to herein as second signal S(210b).

First and second signals S(210b) are directed to low pass filters 218 and 224 to produce output signals S(218) and S(224), which are subsequently directed to differential amplifier 228, respectively. Differential amplifier 228 produces an output signal S(228) which indicates the difference in amplitude between signals S(232) and $S_{LO}$. Such signal S(228) is subsequently used to adaptively control gain and phase adjuster 120 such that the amplitude of output signal S(122) matches or substantially matches the amplitude of previous output signals S(122).

Advantageously, the present invention automatic gain and phase controller use of a common log detector 210 to measure and saturate the amplitudes of input signals S(232) and $S_{LO}$ eliminates variations in amplitude measurement and saturation that might be present due to the use of multiple log detectors. Similarly, the present invention automatic gain and phase controller use of a same reference signal S(204) to mix with first and second signals S(210a) eliminates variations in phase measurements.

Although the present invention has been described in considerable detail with reference to certain embodiments, other versions are possible. For example, signals S(232) and $S_{LO}$ may be inputted to a limiter (instead of the log detector) for purposes of saturating the amplitudes of the signals (before the signals are inputted to the mixer). Therefore, the spirit and scope of the present invention should not be limited to the description of the embodiments contained herein.

We claim:

1. A method for controlling amplitude and phase of an output signal S comprising the steps of:
    splitting the output signal S(out) into output signals S(a) and S(b);
    saturating the output signal S(a) to produce a saturated output signal S(a);
    adjusting the amplitude and phase of the output signal S(b) to produce an adjusted output signal S(b), wherein the amplitude and phase of the output signal are initially adjusted to substantially match the amplitude and phase of an input signal S(in);
    inputting the adjusted output signal S(b) to a log detector to produce a saturated adjusted output signal S(b) and a first signal S(log) indicating the amplitude of the adjusted output signal S(b);
    mixing the saturated adjusted output signal S(b) with the saturated output signal S(a) to produce a first mixed signal;
    inputting the input signal S(in) to the log detector to produce a saturated input signal S(in) and a second signal S(log) indicating the amplitude of the input signal S(in);
    mixing the saturated input signal S(in) with the saturated output signal S(a) to produce a second mixed signal;
    determining a phase difference between the adjusted output signal S(b) and the input signal S(in) using the first and second mixed signals; and
    determining an amplitude difference between the adjusted output signal S(b) and the input signal S(in) using the first and second signals S(log).

2. The method of claim 1 comprising the additional step of:
    alternately inputting the adjusted output signal S(b) and the input signal S(in) to the log detector.

3. The method of claim 2, wherein the step of alternately inputting is performed using an oscillator and a switch having a first and a second position, the adjusted output signal S(b) being inputted when the switch is in the first position, the input signal S(in) being inputted when the switch is in the second position.

4. The method of claim 3, wherein the oscillator causes the switch to alternate between the first and second positions every 10 MHz.

5. The method of claim 1, wherein the step of determining the phase difference comprises the steps of:
    inputting the first mixed signal into a first low pass filter to produce a first low pass filtered output; and
    inputting the second mixed signal into a second low pass filter to produce a second low pass filtered output.

6. The method of claim 5, wherein the step of determining the phase difference comprises the steps of
    inputting the first and second low pass filtered outputs to a differential amplifier.

7. The method of claim 1, wherein the step of determining the amplitude difference comprises the steps of:
    inputting the first signal S(log) to a first low pass filter to produce a first low pass filtered output; and
    inputting the second signal S(log) to a second low pass filter to produce a second low pass filtered output.

8. The method of claim 7, wherein the step of determining the phase difference comprises the steps of:
    inputting the first and second low pass filtered outputs to a differential amplifier.

9. A method for controlling amplitude and phase of an output signal S comprising the steps of:
    splitting the output signal S(out) into output signals S(a) and S(b);
    saturating the output signal S(a) to produce a saturated output signal S(a);
    adjusting the amplitude and phase of the output signal S(b) to produce an adjusted output signal S(b), wherein the amplitude and phase of the output signal are initially adjusted to substantially match the amplitude and phase of an input signal S(in);
    inputting the adjusted output signal S(b) to a limiter to produce a saturated adjusted output signal S(b) and to a log detector to produce a first signal S(log) indicating the amplitude of the adjusted output signal S(b);
    mixing the saturated adjusted output signal S(b) with the saturated output signal S(a) to produce a first mixed signal;
    inputting the input signal S(in) to the limiter to produce a saturated input signal S(in) and to a log detector to produce a second signal S(log) indicating the amplitude of the input signal S(in);
    mixing the saturated input signal S(in) with the saturated output signal S(a) to produce a second mixed signal;
    determining a phase difference between the adjusted output signal S(b) and the input signal S(in) using the first and second mixed signals; and
    determining an amplitude difference between the adjusted output signal S(b) and the input signal S(in) using the first and second signals S(log).

10. The method of claim 9 comprising the additional step of:
    alternately inputting the adjusted output signal S(b) and the input signal S(in) to the log detector.

11. An automatic gain and phase controller comprising:

a directional coupler for receiving an output signal S(out) and directing output signals S(a) and S(b);

a limiter for saturating the amplitude of the output signal S(a) to produce a saturated output signal S(a);

an attenuator for adjusting the amplitude of the output signal S(b) to produce a first adjusted output signal S(b), the attenuator being initially configured to adjust the amplitude of the output signal S(b) to be substantially equal to the amplitude of an input signal S(in);

a phase shifter for shifting the phase of the first adjusted output signal S(b) to produce a second adjusted output signal S(b), the phase shifter being initially configured to shift the phase of the first adjusted output signal S(b) to be substantially equal to the phase of the input signal S(in);

a first switch having a first and second position for receiving and directing the input signal S(in) and the second adjusted output signal S(b), the first switch having an output signal comprising the second adjusted output signal S(b) when in the first position, the first switch having an output signal comprising the input signal S(in) when in the second position;

a log detector for saturating and measuring the amplitude of the first switch output signal to produce a saturated first switch output signal and a signal S(log) indicating a log of the amplitude of the first switch output signal;

a mixer for mixing the saturated first switch output signal with the saturated output signal S(a) to produce a mixed signal;

a second switch having a first and second position for receiving and directing the mixed signal, the second switch producing a second switch output signal;

a first low pass filter for receiving the second switch output signal when the second switch is in the first position and producing a first low pass filtered output signal;

a second low pass filter for receiving the second switch output signal when the second switch is in the second position and producing a second low pass filtered output signal;

a first differential amplifier for receiving the first and second low pass filtered output signals and producing a first differential amplifier output signal indicative of a phase difference between the second adjusted output signal S(b) and the input signal S(in);

a third switch having a first and second position for receiving and directing the signal S(log), the third switch producing a third switch output signal;

a third low pass filter for receiving the third switch output signal when the second switch is in the first position and producing a third low pass filtered output signal;

a fourth low pass filter for receiving the third switch output signal when the second switch is in the second position and producing a fourth low pass filtered output signal; and a second differential amplifier for receiving the third and fourth low pass filtered output signals and producing a second differential amplifier output signal indicative of an amplitude difference between the second adjusted output signal S(b) and the input signal S(in).

12. The automatic gain and phase controller of claim 11 further comprising:

an oscillator for switching the first, second and third switches between the first and second positions.

13. The automatic gain and phase controller of claim 12, wherein the oscillator is a 10 MHz oscillator.

14. A feed forward circuit comprising:

a first directional coupler for receiving an input signal S and outputting signals S(a) and S(b) using the input signal S;

a first gain and phase adjuster for adjusting the amplitude gain and phase of the signal S(a) to produce a signal S(a1)

a main amplifier for amplifying the signal S(a1) to produce a signal S(main) having a distortion signal D(main) and an amplified signal S(a1);

a second directional coupler for outputting a first signal S(main) and a second signal S(main) using the signal S(main);

a first delay for delaying the first signal S(main) to produce a delayed first signal S(main);

a second delay for delaying the signal S(b) to produced a delayed signal S(b);

a first cancellation circuit for combining the delayed signal S(b) and the second signal S(main) to produce a signal S(cancel) having a first signal representative of the distortion signal D(main);

a third directional coupler for outputting a first signal S(cancel) and a second signal S(cancel) using the signal S(cancel);

a second gain and phase adjuster for adjusting the amplitude and phase of the first signal S(cancel) to produce a signal S(adjust) having a second signal representative of the distortion signal D(main);

a correction amplifier for amplifying the signal S(adjust) to produce a signal S(correct) having an amplified second signal representative of the distortion signal D(main);

a fourth directional coupler for outputting a first signal S(correct) and a second signal S(correct) using the signal S(correct);

a splitter for splitting the second signal S(cancel) into a first signal S(split) and a second signal S(split):

a log detector for producing a signal S(amp) representative of the amplitude of the first signal S(split):

a null circuit for controlling the first gain and phase adjuster using the signal S(amp);

an automatic gain and phase controller for controlling the second gain and phase adjuster using the first signal S(correct) and the second signal S(split); and a second cancellation circuit for combining the second signal S(correct) and the delayed first signal S(main) to produce a signal S(output) having a signal representative of the amplified signal S(a).

* * * * *